US006780735B2

(12) United States Patent
Jagannathan et al.

(10) Patent No.: US 6,780,735 B2
(45) Date of Patent: Aug. 24, 2004

(54) METHOD TO INCREASE CARBON AND BORON DOPING CONCENTRATIONS IN SI AND SIGE FILMS

(75) Inventors: Basanth Jagannathan, Stormville, NY (US); Jack O. Chu, Manhasset, NY (US); Ryan W. Wuthrich, Burlington, VT (US); Byeongju Park, Wappingers Falls, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/843,783

(22) Filed: Apr. 30, 2001

(65) Prior Publication Data

US 2002/0160587 A1 Oct. 31, 2002

(51) Int. Cl.[7] .............................................. H01L 21/04
(52) U.S. Cl. ...................................... 438/510; 438/658
(58) Field of Search ............................... 438/471, 510, 438/658, 518, 933, 932

(56) References Cited

U.S. PATENT DOCUMENTS

| 4,697,202 A | 9/1987 | Sher ............................. 357/63 |
| 4,716,048 A | 12/1987 | Ishihara et al. |
| 4,717,681 A | 1/1988 | Curran .......................... 437/31 |
| 4,726,963 A | 2/1988 | Ishihara et al. |
| 4,853,251 A | 8/1989 | Ishihara et al. |
| 4,885,614 A | * 12/1989 | Furukawa et al. ........... 257/183 |
| 5,018,479 A | 5/1991 | Markunas et al. |
| 5,180,690 A | * 1/1993 | Czubatyj et al. ............ 136/258 |
| 5,323,031 A | 6/1994 | Shoji et al. .................. 257/198 |
| 5,441,901 A | 8/1995 | Candelaria ..................... 437/31 |
| 5,846,867 A | 12/1998 | Gomi et al. ................. 438/318 |
| 5,961,877 A | 10/1999 | Robinson et al. |
| 5,986,287 A | 11/1999 | Eberl et al. |
| 6,027,975 A | 2/2000 | Hergenrother et al. |
| 6,051,509 A | 4/2000 | Tsuchiaki |
| 6,064,081 A | 5/2000 | Robinson et al. |

FOREIGN PATENT DOCUMENTS

| EP | 0 504 875 A2 | 9/1992 |
| WO | WO 98/26457 | 6/1998 |

* cited by examiner

*Primary Examiner*—W. David Coleman
(74) *Attorney, Agent, or Firm*—McGuire Woods; Joseph P. Abate

(57) ABSTRACT

We provide a method of doping an Si or SiGe film with carbon or boron. By reducing the silicon precursor pressure, heavily-doped films may be obtained. A single dopant source may be used. The doped Si and SiGe films are of suitable quality for use in a transistor such as an HBT.

9 Claims, 4 Drawing Sheets

METHOD TO INCREASE CARBON AND BORON DOPING CONCENTRATIONS IN SI AND SIGE FILMS

DESCRIPTION

1. Field of the Invention

The invention generally relates to semiconductor manufacturing, and more particularly, to methods for increasing carbon and boron dopant concentrations in silicon and silicon germanium films that are epitaxially deposited.

2. Background of the Invention

In semiconductor manufacturing, methods have developed for making semiconductor devices, some of which are wafers based on silicon ("Si") or silicon germanium ("SiGe") films. Si films are widely used with many applications. For SiGe, an important use has been in electrical components known as heterojunction bipolar transistors ("HBT"). Si films also are used for HBTs. For depositing Si and SiGe films, certain conventional epitaxial deposition techniques have been developed. U.S. Pat. Nos. 4,716,048; 4,726,963; 4,853,251; 5,018,479; 5,961,877; 5,986,287; 6,027,975; 6,064,081. Silicon and silicon germanium layers have been grown via ultra-high-vacuum chemical vapor deposition ("UHV-CVD") low temperature epitaxy ("LTE") processes. After such growth of an Si or Si—Ge layer, collector, base and emitter doping regions are subsequently defined.

Those working with transistor technology have found high carbon ("C") content in silicon and silicon germanium films to be important for maximizing performance of HBTs made from SiGe or Si films. In growing films, temperatures of less than 800° C. generally are used, while in doping applications, lower temperatures generally are used, below 750° C. There have been processes for providing high levels of carbon (i.e, for alloy manufacture) at high temperatures, greater than 800° C., but these processes are unsuitable for semiconductor manufacture because carbon control cannot be controlled in the range of interest. When temperature is reduced, achieving carbon incorporation becomes a problem. Controllably incorporating carbon at ranges of less than 1% at low temperatures has eluded semiconductor manufacturers.

Although high levels of carbon doping have been desired in Si and SiGe films to obtain requisite device characteristics, conventional processes have not provided such high carbon levels, especially for SiGe films. When a germanium precursor source is started, the growth rate rapidly increases, providing too little time for introduction of desired dopants, such as carbon. The desired higher carbon levels have eluded SiGe film manufacturers, who generally have found that carbon incorporation in SiGe decreases significantly as the Ge content in the film increases. For certain conventional processes for making SiGe films, FIG. 1 summarizes data for carbon concentration as a function of the flow of the carbon source, with separate plots shown for various Ge content in the SiGe film. In FIG. 1, film growth is performed using Ge incorporation calibrations. The vertical displacement of the curves indicates carbon incorporation is strongly decreased for even slight Ge content. One implication of such data (i.e., FIG. 1) for conventional SiGe processes is that to achieve a desired level of carbon doping in SiGe (such as an SiGe film containing 15% Ge) may require a carbon flow 20 times (or more) the carbon flow used to produce the same carbon doping level in an Si film. Therefore, it has been conventionally thought that a process for doping SiGE films with a single carbon source would require a mass flow controller over a range exceeding two orders of magnitude, greater than what would be feasible. Thus, a single carbon source system appearing infeasible, the conventional method has been to use two ethylene source gases with different concentrations; one for doping Si and the other for doping SiGe. Such a method has its own problems, including undesirably requiring hardware additions to the LTE tool and also space for an additional gas source, making dual-source set-ups relatively costly and difficult to install and maintain. Also, with such a method, large pressure changes (normally undesirable for UHV-CVD growth) may occur for SiGe growth as more Ge is added.

The problem of increasing the carbon content in SiGe films has persisted and resisted solution. For example, it was thought that the high growth rates encountered during the SiGe growth with higher Ge fractions was responsible for the low levels of carbon incorporation, and thus, lowering the growth temperature was attempted. However, lowering the growth temperature by 15° C. reduces the growth rate by a factor of $\frac{2}{3}$ without significantly increasing carbon incorporation.

Thus, the conventional processes for doping Si—Ge and Si films do not necessarily produce films with desired characteristics. Even when processes can be constructed to produce certain desired characteristics, such processes are not necessarily simple or suited to large-scale manufacturing. There especially remains a need to improve carbon incorporation into SiGe films.

SUMMARY OF THE INVENTION

It therefore is an object of this invention to provide a method to improve incorporation of a dopant such as carbon or boron into Si and SiGe films, such as during production of a film by UHV-CVD. Advantageously, the present invention provides such desired higher levels of carbon in Si and SiGe film, using existing hardware and not requiring a higher-concentration carbon source or any additional mass flow controller. Another advantage of the present invention is that film growth may proceed at low pressures, and at temperatures of under 800° C., preferably at 600° C. or less. A further advantage of the invention is that by avoiding high temperatures, at which impurities such as oxygen necessarily would be introduced, introduction of impurities is correspondingly avoided. Additionally, the present invention advantageously provides pressure-balanced processes, in which pressure spikes during film growth may be avoided. In the methods and articles according to the invention, these benefits are provided without adversely affecting other growth parameters, such as the number of impurities, the number of defects, whether doping is spiked, controllability, manufacturability, etc.

In order to accomplish these and other objects of the invention, the present invention in a preferred embodiment provides a method of reducing film growth rate when growing a carbon- or boron-doped silicon film or silicon-germanium film, comprising carbon or boron-doping while supplying a silicon precursor and optionally a germanium precursor to a substrate, at reduced pressure of about 0.1 to 100 millitorr. The invention also provides a method of growing a film without sharp pressure transitions, by such a step.

In a preferred embodiment, the doping is at a temperature of less than 800° C. In a particularly preferable embodiment, the doping is by a precursor supply that is a single source.

The inventive method in a preferred embodiment may include supplying germanium precursor to the substrate. In a particularly preferred embodiment, the film has a germanium content of 1 to 30% by weight.

In a preferred embodiment, the film has a dopant content of about $1 \times 10^{17}$ to $1 \times 10^{21}/cm^3$. Another preferred embodiment is a silicon or silicon-germanium film doped with carbon or boron wherein the dopant profile is spiked. In a further preferred embodiment, the invention provides a transistor comprising a silicon-germanium-carbon layer with a carbon content of about $1 \times 10^{17}$ to $^{21}/cm^3$.

BRIEF DESCRIPTION OF THE DRAWINGS

The foregoing and other objects, aspects and advantages will be better understood from the following detailed description of the preferred embodiments of the invention with reference to the drawings, in which:

FIG. 5 is a material profile vertically through FIG. 4.

DETAILED DESCRIPTION OF THE PREFERRED EMBODIMENTS OF THE INVENTION

Figure 1:
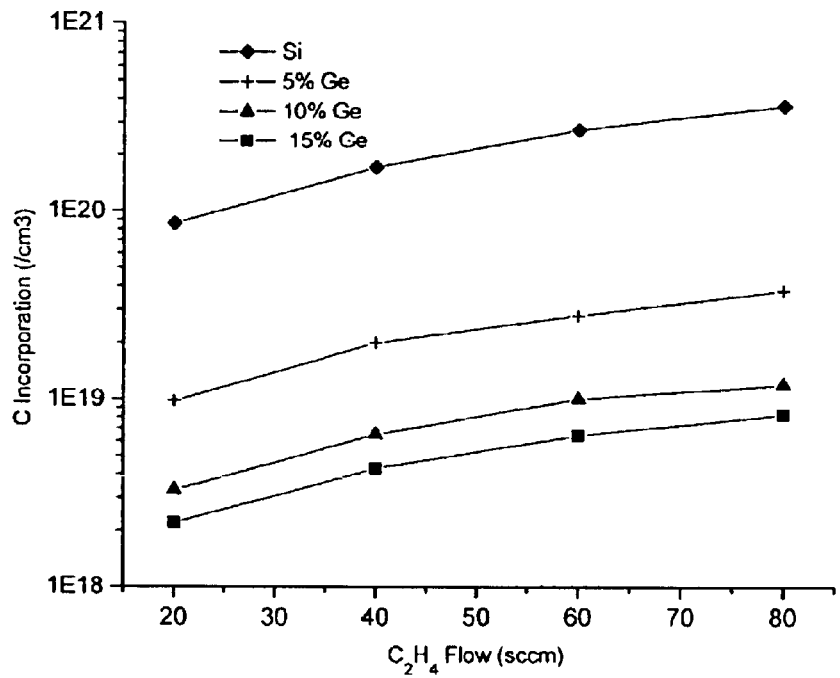
FIG. 1 is a graph of carbon concentration versus carbon precursor flow for each of four conventional processes, including production of a silicon film having 0%, 5%, 10% and 15% Ge, respectively.
Figure 2:
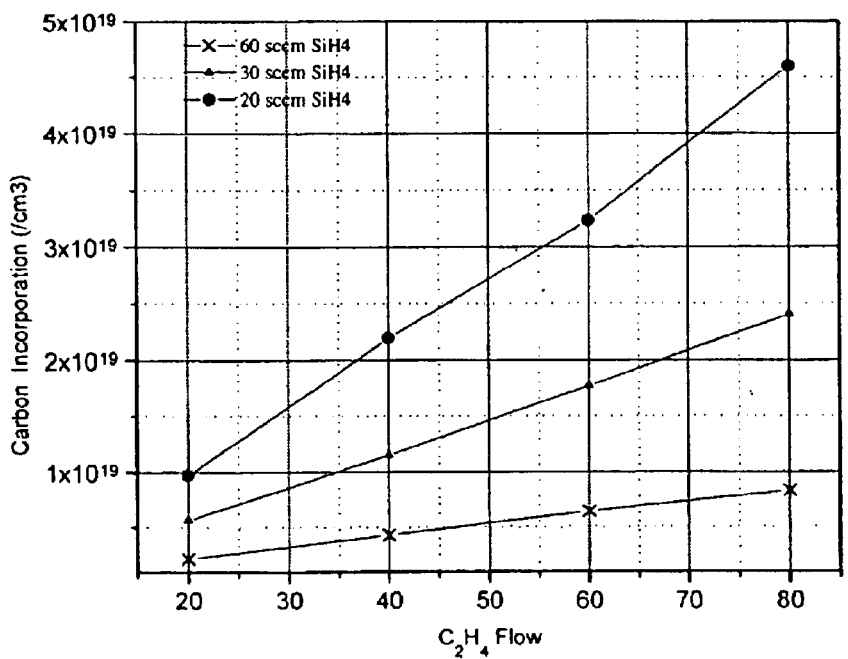
FIG. 2 is a graphical comparison of dopant incorporation according to the invention as a function of the ratio of Si precursor to Ge precursor.

The invention exploits a discovery by the inventors that, when supplying silicon and dopant precursors to a substrate, reducing the silicon precursor increases dopant incorporation. In practicing the invention, germanium precursors optionally may be supplied, and the Ge content of the film may be 0–99% by weight, preferably 1–30% by weight. An example of dopant incorporation according to the invention is illustrated in FIG. 2. FIG. 2 shows carbon incorporation for SiGe films where growth is performed with lowered silicon precursor (e.g., silane) and germanium precursor (e.g., germane) ratios. SiGe films with 15% Ge are shown, by way of example, in FIG. 2, but in the invention the Ge content of the film is not particularly limited and may be 0–99%. Desired device Si and SiGe profiles are obtained by doping using lowered partial pressures of Si and Ge precursors. Under these conditions, carbon incorporation in Si and SiGe films is increased for a constant partial pressure level of carbon precursor. Although FIG. 2 is shown for carbon, it will be appreciated that advantageous results likewise are obtained for boron.

By reducing the partial pressure of the Si precursor, or, where Si and Ge precursors are used, of the Si and Ge precursors, reduction of the film growth rate can be achieved. Such a reduction in the film growth rate permits increased dopant incorporation. For example, when carbon-doping with a 30 sccm silane calibration, the growth rate of an SiGe film that is 15% Ge may be slowed to about $\frac{2}{3}$ of the growth rate when using a 60 sccm silane calibration, which corresponds to doubled carbon incorporation in the lowered calibration. By further lowering the silicon precursor levels (and hence the germanium precursor levels, where a germanium precursor is also supplied) the carbon incorporation may be further increased.

Such silicon precursor level-lowering is a completely non-intuitive method to increase a dopant (or an impurity) incorporation in silicon or silicon germanium epitaxy, because normally, an increase in dopant incorporation is associated with increasing the partial pressure of the dopant precursor species, and not with decreasing the partial pressure or flow rate of film forming gases. FIG. 2, which plots the dopant (e.g., carbon) level as a function of dopant precursor (e.g., $C_2H_4$) flow and silicon precursor (e.g., $SiH_4$) flow for trebled flows (e.g., 20 sccm to 60 sccm) shows that adjusting the silicon precursor (e.g., $SiH_4$) partial pressure may advantageously change the dopant (e.g., carbon) level over a factor of 4. It will be appreciated that this four-fold increase in dopant concentration that is seen in FIG. 2 is one example of an increase that may be seen according to the invention, and that for other combinations of flow rates, silicon precursors, germanium precursors, dopant precursors and the like, other dopant concentration increases may be obtained.

In the invention, as an Si precursor, silane or other Si precursors may be used. A Ge precursor is optionally used in the invention. As a Ge precursor, germane or other Ge precursors may be used.

As the dopant, carbon or boron may be used. For carbon doping, ethylene and methyl silane are examples of carbon precursors. For boron doping, diborane is an example of a boron precursor. In a most preferred embodiment, the dopant precursor flow is a single source. Thus, the invention advantageously provides a doping method that avoids a second dopant precursor source. The present invention provides a system for production of doped SiGe and Si films that is less costly and simpler to install and maintain than conventional systems, such as dual-ethylene source systems.

In the invention, the Si precursor partial pressure (and, when a Ge precursor is used, the Ge precursor partial pressure) are reduced. The reduced pressure may be selected based on volume of the chamber in which the film is produced, pumping speed of the pump supplying the precursors, and the like. Known techniques for changing the partial pressure at which the silicon precursor is delivered may be used. A preferred example of reduced partial pressures of silane as a silicon precursor may be a range of about 1 to 100 millitorr.

The present invention may use existing hardware and production lines for producing Si or SiGe films, without modification or with minor modification to provide for Si precursor partial pressure adjustment. The present invention identifies Si precursor partial pressure as a way of effectively extending the doping level range, useable with conventional production line hardware. By using the inventive method, a 3-fold change in the reactant flow may quadruple, or more, the dopant incorporation rate. Also, because there is an overall reduction in pressure during the dopant incorporation when growth is performed under reduced silicon precursor/germanium precursor partial, the system pressure still remains within the 10 mTorr range which is considered desirable for performing low pressure epitaxy.

The present invention advantageously balances film growth rate versus dopant incorporation, while providing extra benefits. The magnitude of the meritorious effect (e.g., increased dopant incorporation) is unexpected relative to the small reduction in growth rate.

In actual process applications, such as device profiles requiring silicon and silicon germanium regions, the dopantfree regions can be grown using a Si calibration which maximizes growth rate (e.g., high silane partial). During the portion of the film profile requiring dopant incorporation, the growth can be seamlessly switched to the low flow calibrations regime, thus maximizing the dopant incorporation while minimizing the pressure perturbations. The change in partial pressures does not result in pressure changes large enough to cause deleterious effects.

Figure 3:
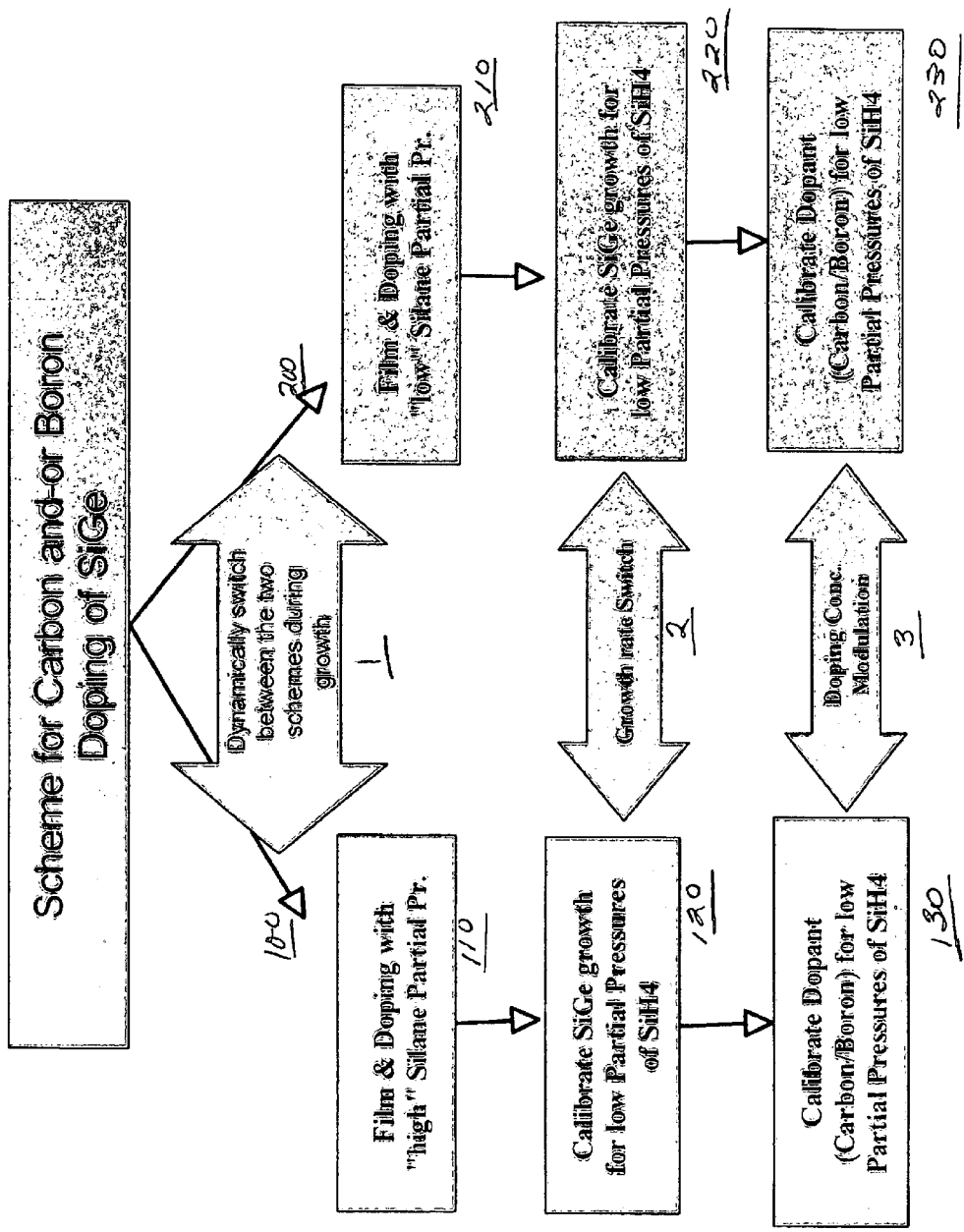
FIG. 3 is a state diagram of doping of a film according to the invention.
Figure 4:
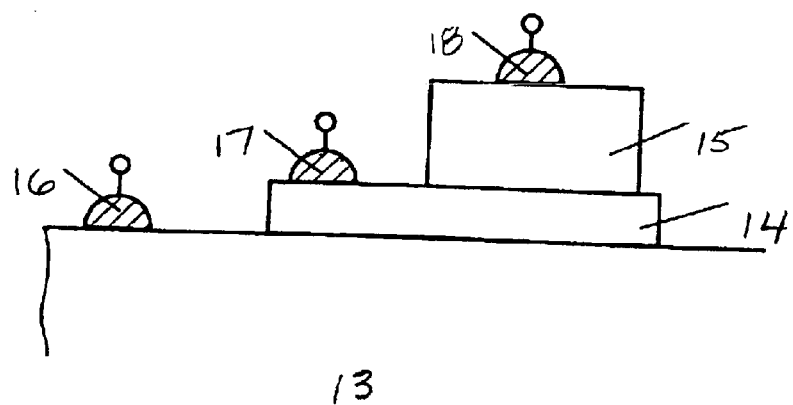
FIG. 4 is a cross-section of a hetero bipolar transistor according to the invention.
Figure 5:
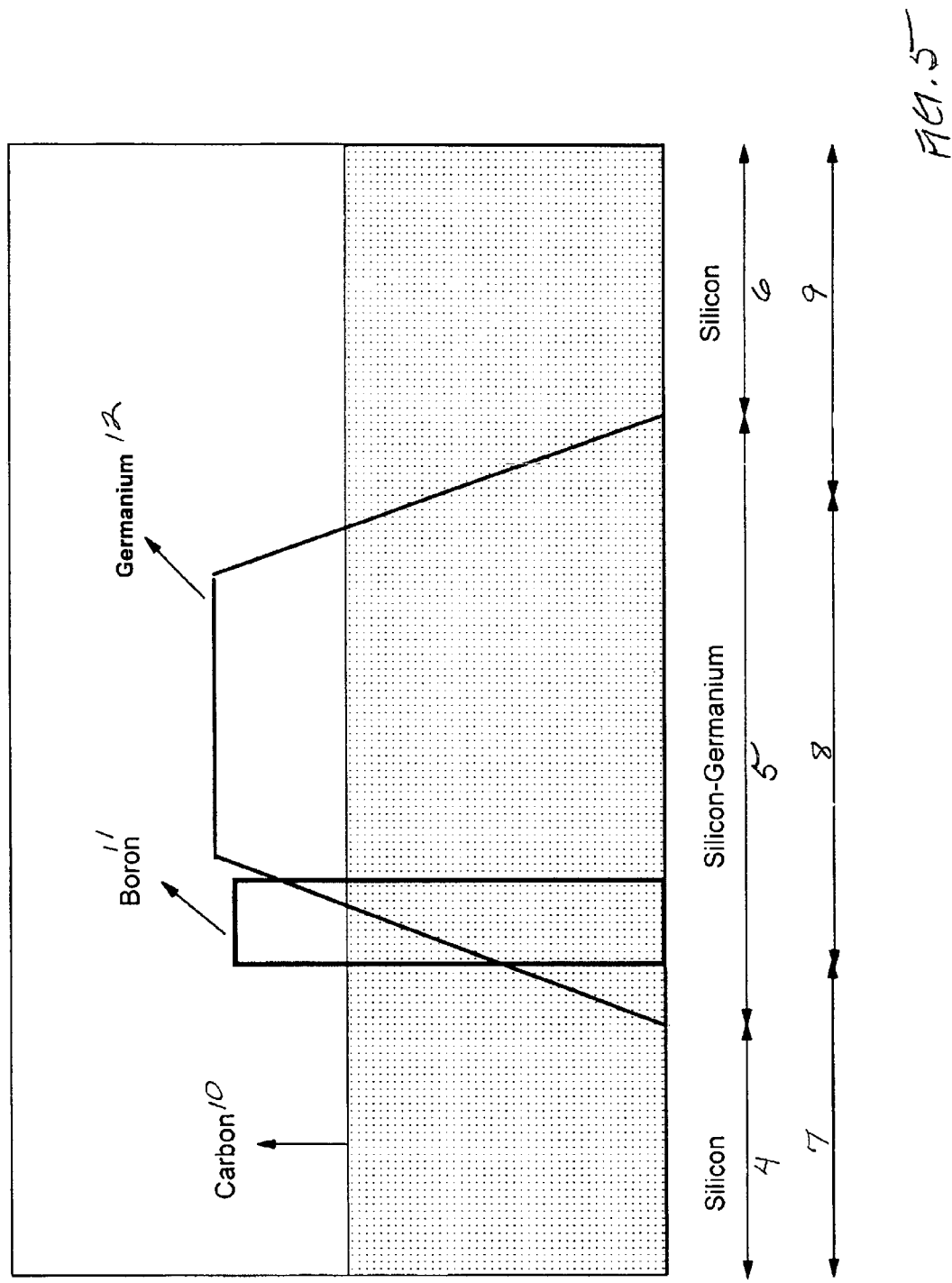
FIG. 5 is a diagram which is an example of dynamic flow switching in growth and doping according to the invention.

Further details of the invention may be seen with reference to FIGS. 3, 4 and 5. FIG. 3 depicts a preferred embodiment of the present invention, in which carbon and/or boron doping of SiGe is provided. (FIG. 3 refers to an SiGe film as a preferred example, but it will be appreciated that the invention is not limited to SiGe films.) The process of FIG. 3 provides for dynamic switching 1 between two growth schemes 100 favoring growth rate and 200 favoring dopant incorporation. As FIG. 3 shows, dopant incorporation is favored by lowering silicon precursor partial pressure, while other parameters may remain unchanged. Dynamic switching according to the invention preferably may be accomplished by using a computerized controller, but could be accomplished manually. Dynamic switching 1 includes growth rate switching 2 and doping concentration modulation 3.

A preferred substrate to use in scheme 100 or 200 is a clean silicon substrate, or a substrate on which has been deposited one or more other layers, such as a silicon layer. However, any substrate using alternative semiconductor material can be used. Schemes 100 and 200 may be performed on the substrate or layered substrate.

It will be appreciated that FIG. 3 is similar to a state diagram in which any sequence of operations may be achieved, as needed, by traversing paths x, y, z and that there is no particular limitation on the number of times that steps 110, 120, 130, 210, 220, 230 are performed for a particular region, and that the steps may be performed so as to provide a region that is doped as desired.

According to FIG. 3, inventive scheme 100 may include steps 110, 120 and 130, beginning with a step of film preparation and doping with "high" silicon precursor partial pressure 110. (Silane is shown by way of example in FIG. 3, but it will be appreciated that other silicon precursors may be used.) In one aspect of FIG. 3, growth rate switching 2 optionally occurs between calibrations 120 and 220. Switching 2 may occur in either direction, from 120 to 220 or from 220 to 120. Switching may occur more than once. Again with reference to FIG. 3, doping concentration modulation 3 optionally occurs between calibrations 130 and 230. Modulation 3 may occur in either direction, from 130 to 230 or from 230 to 130. Modulation may occur more than once.

An example of a process according to the invention is to produce an SiGe film, beginning with a step 110 followed by calibrating SiGe growth for low partial pressures of silicon precursor 120 followed by calibrating the dopant for low partial pressures of silicon precursor 130. Although scheme 100 is shown in FIG. 3 to have steps 110, 120 and 130, it will be appreciated that additional steps or processes or optimization techniques may be used.

Scheme 200 may include steps 210, 220 and 230, beginning with a step of film preparation and doping with "low" silicon precursor partial pressure 210. Such a step 210 may be followed by calibrating SiGe growth for low partial pressures of silicon precursor 220 followed by calibrating the dopant (e.g., carbon/boron) for low partial pressures of silicon precursor 230. Measuring and setting the pressures in calibrations 220 and 230 may be accomplished using known techniques. Although scheme 200 is shown in FIG. 3 to have steps 210, 220 and 230, it will be appreciated that additional steps or processes or optimization techniques may be used.

A film made according to the invention is shown in FIG. 5, a state diagram in which the x-axis reflects growth conditions and the y-axis reflects the relative doped regions that may be produced. In FIG. 5, a first silicon region 4, a silicon-germanium region 5 and a second silicon region 6 are shown on the x-axis. Process region 7 on the x-axis was grown under high silicon precursor partial pressure (i.e., step 110 in FIG. 3). Region 8 on the x-axis was grown under low silicon precursor partial pressure (i.e., step 120 in FIG. 3), chosen for desired dopant content (i.e., 3 in FIG. 3). Region 9 on the x-axis was grown under high silicon precursor partial pressure (i.e., step 110 in FIG. 3), chosen to provide a desired growth rate (i.e., 2 in FIG. 3). Thus, a Si—Ge wafer may be produced having high, constant carbon content 10 (shown in the dotted region) for all Si, Si—Ge and Si regions shown in FIG. 5. The boron content 11 may be provided by the calibrating 130 and/or 230 with growth rate switching 2 of FIG. 3. The germanium content 12 may be provided by the calibrating 120 and/or 220 with doping concentration modulation 3 of FIG. 3.

The methods set forth above according to the invention may be performed during an epitaxial deposition process, such as UHV-CVD or rapid thermal chemical vapor deposition ("RTCVD"). A "low" temperature, namely about 300 to 800° C., may be used. In a preferred embodiment, the temperature may be about 500 to 600° C.

When a silicon or silicon-germanium film is made with carbon-doping according to the invention, using an ethylene gas source that is 0.35% $C_2H_4$ in helium (He), carbon levels as high as $10^{19}$–$10^{20}$/cm$^3$ may be obtained. Dopant content in other examples of Si—Ge epitaxially grown layers may be seen with reference to FIG. 2.

Si and SiGe films according to the invention may be characterized by the borders where dopant introduction is begun or stopped. Particularly, the invention makes possible production of films having spiked borders where the dopant is introduced or stopped, rather than tailing borders.

The present invention provides regions very controllably, with great precision. The doping level may be controlled as desired, according to the user and desired structure, such as type of transistor.

The present invention may be used in producing an HBT, an example of which may be seen with reference to FIG. 4. A p-conductive Si—Ge—C layer 14 that was epitaxially deposited according to the invention is shown on an n-conductive silicon under-layer 13. The Si—Ge—C layer 14 of FIG. 4 corresponds to region 5 on FIG. 5. Referring again to FIG. 4, a further n-conductive silicon layer 15 has been epitaxially deposited on the p-conductive Si—Ge—C layer 14. The n-conductive silicon under-layer serves as a collector and is provided with an electrode 16. The carbon-containing Si—Ge layer 14 serves as the base and has an electrode 17. The n-conductive silicon layer 15 serves as the emitter and is provided with electrode 18.

Doped Si and Si—Ge films and compositions according to the invention may be used in HBT production and as etch-stops. By performing in-situ doping of the collector and base regions in an LTE film that is an Si or SiGe film according to the invention, transistor speeds in excess of 150 Ghz may be achieved. However, processes and doped Si and SiGe films of the present invention are not limited to such applications.

The processes according to the invention may be performed according to batch processes, or for single wafer embodiments. Advantageously, the present invention may be performed as a furnace process, with a lot of wafers put together in a batch. Such a set-up provides environmental and cost benefits, by avoiding waste of gases.

While the invention has been described in terms of its preferred embodiments, those skilled in the art will recognize that the invention can be practiced with modification within the spirit and scope of the appended claims.

We claim:

1. A method of reducing film growth rate when growing a carbon- or boron-doped silicon film or silicon-germanium film, comprising:

carbon or boron-doping while supplying a silicon precursor and optionally a germanium precursor to a substrate, at reduced pressure of about 0.1 to 100 millitorr at a temperature of below about 800° C., wherein said step of doping while supplying includes supplying a dopant precursor from a single source to the substrate at a substantially constant flow rate while lowering a flow rate of the silicon precursor, whereby a concentration of the dopant in the substrate increases and a dopant profile can be spiked.

2. The method of claim 1, including supplying germanium precursor to the substrate.

3. The method of claim 1, wherein the film has a dopant content of about $1 \times 10^{17}$ to $1 \times 10^{21}/cm^3$.

4. The method of claim 1, wherein the doping is at a temperature of less than 800° C.

5. A method according to claim 1, wherein the dopant is carbon.

6. A method according to claim 2, wherein the dopant is carbon.

7. The method according to claim 6 wherein the carbon doping is by a carbon precursor supply that is a single source.

8. The method according to claim 2, wherein the film has a germanium content of 1 to 30% by weight.

9. A method of reducing film growth rate whets growing a carbon or boron-doped silicon film or silicon-germanium film, comprising:

carbon or boron-doping while supplying a silicon precursor and optionally a germanium precursor to a substrate, at reduced pressure of about 0.1 to 100 millitorr, wherein at least one of Si and SiGe films have spiked borders where dopant introduction of the carbon or boron-doping has been first introduced or stopped.

* * * * *